(12) United States Patent
Kim

(10) Patent No.: US 6,180,474 B1
(45) Date of Patent: Jan. 30, 2001

(54) METHOD FOR FABRICATING SEMICONDUCTOR DEVICE

(75) Inventor: Hong-Seog Kim, Cheongju (KR)

(73) Assignee: Hyundai Electronics Industries Co., Ltd., Kyoungki-Do (KR)

( * ) Notice: Under 35 U.S.C. 154(b), the term of this patent shall be extended for 0 days.

(21) Appl. No.: 09/401,533

(22) Filed: Sep. 22, 1999

(30) Foreign Application Priority Data

May 10, 1999 (KR) .................................................. 99/16623

(51) Int. Cl.[7] .................................................. H01L 21/336
(52) U.S. Cl. .......................... 438/304; 438/583; 438/596
(58) Field of Search ................................. 438/197, 303, 438/304, 306, 583, 585, 595, 596

(56) References Cited

U.S. PATENT DOCUMENTS

| | | | |
|---|---|---|---|
| 5,227,320 | * 7/1993 | Johnson et al. | 438/304 |
| 5,256,585 | * 10/1993 | Bae | 438/596 |
| 5,686,329 | * 11/1997 | Chang et al. | 438/304 |
| 6,063,681 | * 5/2000 | Son | 438/303 |

* cited by examiner

*Primary Examiner*—Trung Dang
(74) *Attorney, Agent, or Firm*—Morgan, Lewis & Bockius LLP

(57) ABSTRACT

A method for fabricating a semiconductor device according to the present invention can facilitate the device to be operated at a high speed by restricting an increase of a resistance of a gate electrode. The method for fabricating the semiconductor device includes a step of forming a gate insulation film on a semiconductor substrate, a step of forming a conductive film on the gate insulation film, a step of forming a conductive film post by patterning the conductive film, a step of forming a first silicide layer at sidewalls of the conductive film post, a step of forming a first impurity layer in the semiconductor substrate at both sides of the conductive film post, a step of forming a sidewall spacer beside the first silicide layer formed at the sidewalls of the conductive film post, and a step of forming a second impurity layer in the semiconductor substrate outside the sidewall spacer.

8 Claims, 3 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and in particular to an improved method for fabricating a semiconductor device which can facilitate the semiconductor device to be operated at a high speed by reducing a wiring resistance of a gate electrode.

2. Description of the Background Art

In general, in order to operate a semiconductor device at a high speed, there has been known a technique of forming a tungsten suicide layer on a polysilicon layer which is a gate electrode of a peripheral circuit transistor of a semiconductor memory integrated circuit devices. In addition, there has been known a technique of forming a self-aligned silicide, namely a salicide layer on a source/drain of the peripheral circuit unit transistor.

FIG. 1 illustrates a structure of a peripheral circuit unit transistor of a conventional semiconductor device. Referring to FIG. 1, a gate insulation film 11 is formed on a semiconductor substrate 10. A gate electrode 12 is formed on the gate insulation film 11. The gate electrode 12 includes a polysilicon layer 12a and a tungsten silicide 12b formed thereon. A sidewall spacer 14 is formed on the semiconductor substrate 10 at the both sides of the gate electrode 12. An impurity layer 13 having a shallow junction which is called a lightly doped drain LDD is formed in the semiconductor substrate 10 below the sidewall spacer 14. An impurity layer 15 having a deep junction which is called a source/drain is formed in the semiconductor substrate 10 beside the impurity layer 13. A self-aligned silicide layer 16 is formed on the gate electrode 12 and the source/drain 15.

However, in the gate electrode structure of the conventional semiconductor device, the tungsten silicide layer is formed on the polysilicon layer, and thus an integration degree of the semiconductor device is increased. Accordingly, when the gate electrode is reduced in size, the polysilicon layer and the silicide layer are also decreased in size, and thus the wiring resistance of the gate electrode cannot be effectively controlled.

SUMMARY OF THE INVENTION

It is therefore an object of the present invention to provide an improved method for fabricating a semiconductor device which can restrict an increase of a wiring resistance of a gate electrode by raising a ratio of a surface area of a silicide layer to a surface area of a polysilicon layer, even if the gate electrode is reduced in size.

In order to achieve the above-described object of the present invention, there is provided a method for fabricating a semiconductor device which forms a silicide layer at both sidewalls of a gate electrode.

The method for fabricating the semiconductor device includes: a step of forming a gate insulation film on a semiconductor substrate; a step of forming a conductive film on the gate insulation film; a step of forming a conductive film post by patterning the conductive film; a step of forming a first silicide layer at sidewalls of the conductive film post; a step of forming a first impurity layer in the semiconductor substrate at both sides of the conductive film post; a step of forming a sidewall spacer beside the first suicide layer formed at the sidewalls of the conductive film post; and a step of forming a second impurity layer in the semiconductor substrate outside the sidewall spacer.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A method for fabricating a semiconductor device in accordance with the present invention will now be explained with reference to the accompanying drawings.

Figure 1:
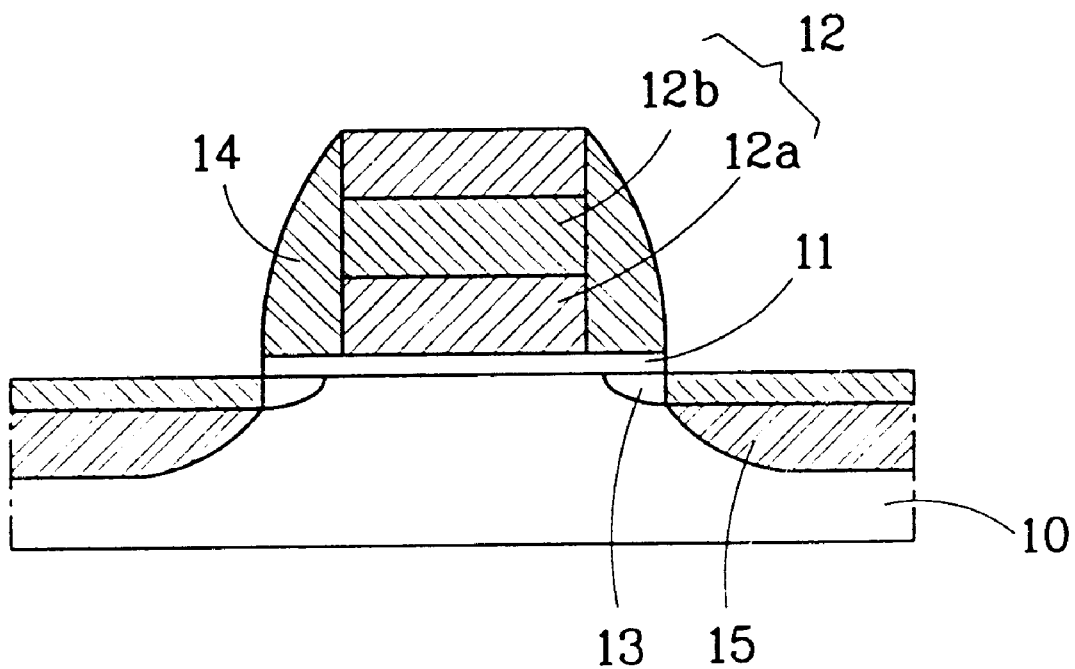
FIG. 1 is a vertical-sectional view illustrating a structure of a conventional semiconductor device.
Figure 2A:
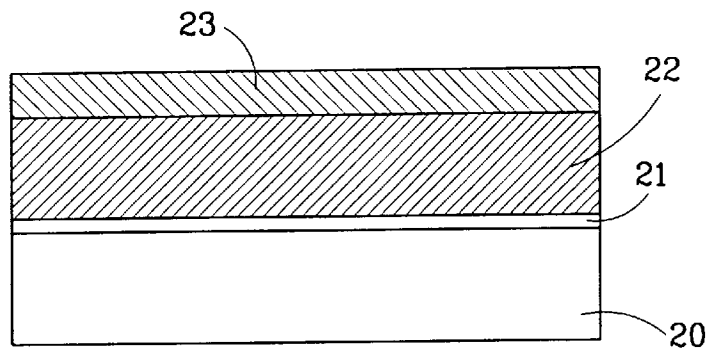
FIGS. 2a to 2e illustrate sequential steps of a method for fabricating a semiconductor device in accordance with the present invention.

Referring to FIG. 2a, a gate insulation film 21 is formed on a semiconductor substrate 20, a polysilicon layer 22 is formed on the gate insulation film 21, and a layer 23 consisting of a material having a remarkably high etching selection ratio to the polysilicon layer 22 is formed on the polysilicon layer 22. The gate insulation film 21 consists of a silicon oxide film, a silicon nitride film or the like. In addition, a silicon nitride film $Si_3N_4$ may be used as a material of the layer 23 having the remarkably high etching selection ratio to the polysilicon layer 22.

Figure 2B:
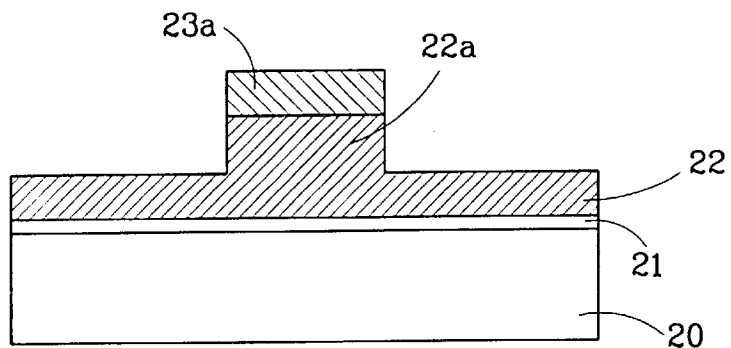

Thereafter, a photo lithography/etching process is carried out on the silicon nitride film 23, thereby forming a silicon nitride film pattern 23a corresponding to a size of a final gate electrode. The polysilicon layer 22 is etched at a predetermined depth by using the silicon nitride film pattern 23a as a mask, and thus a polysilicon post 22a is formed as shown in FIG. 2b.

Figure 2C:
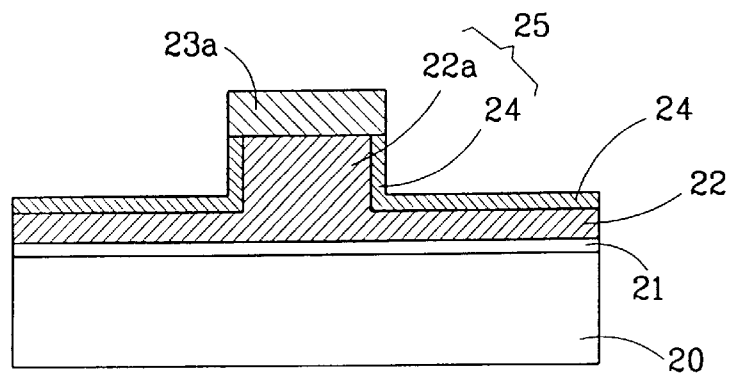

A metal layer (not shown), such as cobalt Co or titanium Ti is formed on the resultant structure of the semiconductor substrate 20, and an annealing process is carried out thereon. As a result, as illustrated in FIG. 2c, a silicide formation reaction takes place at a junction of the polysilicon layer 22 and the metal layer, thereby forming a first silicide layer 24.

Figure 2D:
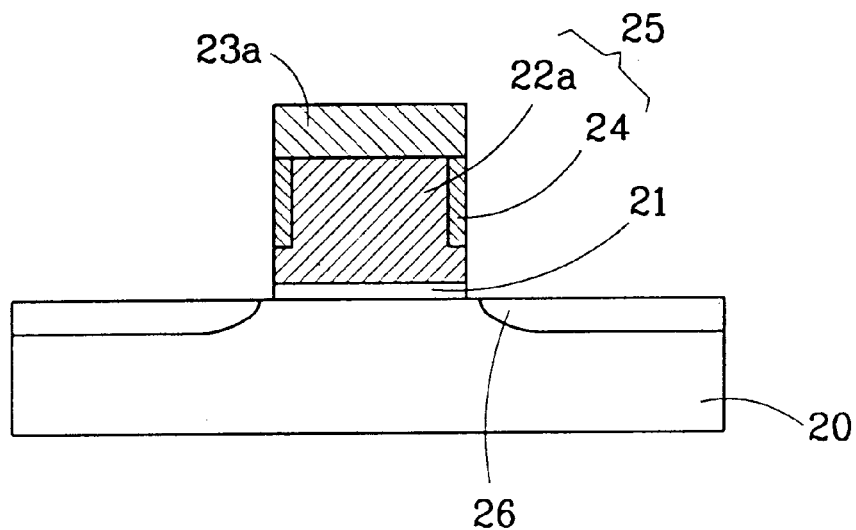
Figure 2E:
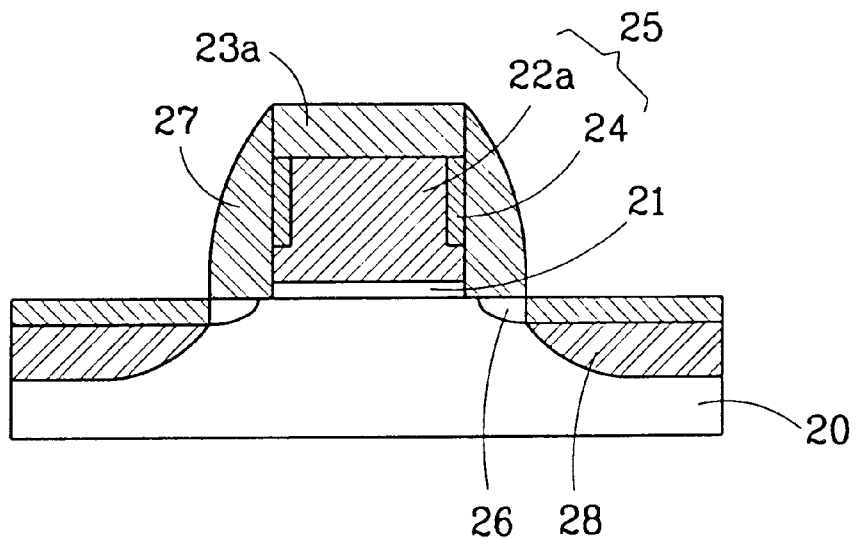

An anisotropic etching process is performed by using the nitride film pattern 23 as a mask, and thus the first silicide layer 24 is removed, except for at the sidewalls of the polysilicon post 22a. Thereafter, the residual polysilicon layer 22a having a predetermined thickness after the etching process as shown in FIG. 2b is etched by using the nitride film pattern 23 as a mask, thereby forming a gate electrode 25 as shown in FIG. 2d. The gate electrode 25 consists of the polysilicon post 22a and the first silicide layer 24 formed at its sidewalls. Therefore, as compared with a conventional method of forming the silicide layer on the polysilicon layer, there is increased a ratio of a surface area of the silicide layer having a relatively low resistance to an entire surface area of the polysilicon having a relatively high resistance. As a result, the resistance of the gate electrode is decreased, and thus the semiconductor device can be operated at a high speed.

Impurity ions are implanted into the semiconductor substrate by employing the nitride film pattern 23 and the gate electrode 25 as a mask, thereby forming a first impurity layer 26 as shown in FIG. 2d.

Thereafter, an insulation film is formed on the resultant structure of FIG. 2d, and the anisotropic etching process is carried out to form a sidewall spacer 27 at the sidewalls of the gate electrode 25 as shown in 2e. The impurity ions are implanted into the semiconductor substrate 20 by using the sidewall spacer 27 as a mask, thereby forming a second impurity layer 28. A junction depth of the second impurity layer 28 is relatively great, as compared with that of the first impurity layer 26. The second impurity layer 28 serves as a source/drain of a transistor.

A second silicide layer 29 is formed on the second impurity layer 28, and thus fabrication of the semiconductor device is completed. According to a method for forming the second silicide layer 29, the second impurity layer 28 is formed, the metal film such as cobalt Co or titanium Ti is formed on the resultant structure of the semiconductor substrate 20, the silicide layer is formed by causing the silicide formation reaction between the second impurity layer 28 and the metal layer by performing an annealing process, and a self-aligning silicide process of removing the metal layer where the silicide formation reaction does not take place is carried out.

On the other hand, the step of forming the second silicide layer on the second impurity layer may be omitted in the process of fabricating the semiconductor device. That is, when the semiconductor device composes a memory cell unit of a semiconductor memory integrated circuit, if the second silicide layer is formed, a leakage current is increased, and thus a refresh period is shortened. In addition, an electrical property of the semiconductor device may be deteriorated due to metal contamination. Accordingly, it is advantageous to apply the step for forming the second suicide layer to an input/output buffer of the semiconductor memory integrated circuit, or an element of a peripheral circuit unit composing a control signal circuit.

According to the present invention, the polysilicon layer post is formed, and the suicide layer is formed at its sidewalls, thereby raising the ratio of the surface area of the silicide layer having a relatively low resistance to the surface area of the polysilicon having a relatively high resistance. As a result, it restricts an increase of the wiring resistance of the gate electrode as much as possible, and thus the semiconductor substrate is operated at a high speed.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a semiconductor device, comprising:
   a step for forming a gate insulation film on a semiconductor substrate;
   a step for forming a conductive film on the gate insulation film;
   a step for forming a conductive film post by patterning the conductive film including a step for forming a silicon nitride film on the conductive film;
   a step for forming a first silicide layer at sidewalls of the conductive film post with the silicon nitride film masking a top surface of the conductive film post;
   a step for forming a first impurity layer in the semiconductor substrate at both sides of the conductive film post;
   a step for forming a sidewall spacer beside the first silicide layer formed at the sidewalls of the conductive film post; and
   a step for forming a second impurity layer in the semiconductor substrate outside the sidewall spacer.

2. The method according to claim 1, wherein the gate insulation film is a silicon oxide film.

3. The method according to claim 1, wherein the conductive film is a polysilicon film.

4. The method according to claim 1, wherein the step for forming the conductive film post, comprises:
   a step for forming a silicon nitride film on the conductive film;
   a step for forming a silicon nitride film pattern in an identical size to the gate electrode by patterning the nitride film; and
   a step for etching the conductive film at a predetermined depth by employing the silicon nitride film pattern as a mask.

5. The method according to claim 4, wherein the step for forming the first silicide layer at the sidewalls of the conductive film post, comprises:
   a step for forming a metal layer on the entire resultant structure of the step for forming the conductive post;
   a step for forming the silicide layer by annealing the metal layer and by causing a silicide formation reaction at a junction between the metal layer and the conductive layer; and
   a step for etching the silicide and the residual conductive film by using the nitride film pattern as a mask.

6. The method according to claim 5, wherein the metal layer is cobalt or titanium.

7. The method according to claim 1, further comprising a step for forming a second silicide layer on the second impurity layer.

8. The method according to claim 7, wherein the step for forming the second silicide layer, comprises:
   a step for forming a metal layer on the entire resultant structure of the step for forming the second impurity layer; and
   a step for causing a silicide formation reaction at a junction of the metal layer and the second impurity layer by annealing the metal layer.

* * * * *